United States Patent [19]

Suzuki

[11] 4,385,307
[45] May 24, 1983

[54] SOLID STATE IMAGE SENSING DEVICE FOR ENHANCED CHARGE CARRIER ACCUMULATION

[75] Inventor: Nobuo Suzuki, Kamakura, Japan

[73] Assignee: Tokyo Shibaura Electric Co., Ltd., Kawasaki, Japan

[21] Appl. No.: 201,998

[22] Filed: Oct. 29, 1980

Related U.S. Application Data

[63] Continuation of Ser. No. 893,829, Apr. 6, 1978, abandoned.

[30] Foreign Application Priority Data

Apr. 8, 1977 [JP] Japan .................................. 52-39553

[51] Int. Cl.³ .................... H01L 29/78; H01L 27/14; H01L 31/00
[52] U.S. Cl. .................................. 357/24; 357/24 M; 357/30
[58] Field of Search .................. 357/24 M, 24 LR, 30

[56] References Cited

U.S. PATENT DOCUMENTS

| | | | |
|---|---|---|---|
| 3,856,989 | 12/1974 | Weimer | 357/24 LR |
| 3,866,067 | 2/1975 | Amelio | 357/24 LR |
| 3,896,474 | 7/1975 | Amelio et al. | 357/24 LR |
| 3,896,485 | 7/1975 | Early | 357/24 LR |
| 3,995,302 | 11/1976 | Amelio | 357/24 LR |
| 4,001,878 | 1/1977 | Weimer | 357/24 LR |
| 4,028,716 | 6/1977 | van Santen et al. | 357/24 LR |
| 4,143,389 | 3/1979 | Kolke et al. | 357/24 LR |
| 4,155,094 | 5/1979 | Ohba et al. | 357/24 M |

Primary Examiner—Gene M. Munson
Attorney, Agent, or Firm—Oblon, Fisher, Spivak, McClelland & Maier

[57] ABSTRACT

A so-called buried channel type solid state image sensing device is formed with a channel layer of the opposite conductivity type in the surface of a semiconductor substrate. An insulating layer is formed on the surface of the semiconductor substrate and spaced apart photoelectrode and a charge transfer electrode are buried in the insulating film and a shift electrode is buried therebetween. A channel layer is provided beneath the photoelectrode and the charge transfer electrode whereas no channel layer is formed beneath the shift electrode. But instead a portion of the surface of the semiconductor substrate is located beneath the shift electrode. Since no channel layer is provided beneath the shift electrode, a sufficient quantity of charge carriers is accumulated in a potential well formed in the channel layer beneath the photoelectrode.

7 Claims, 8 Drawing Figures

FIG. 1
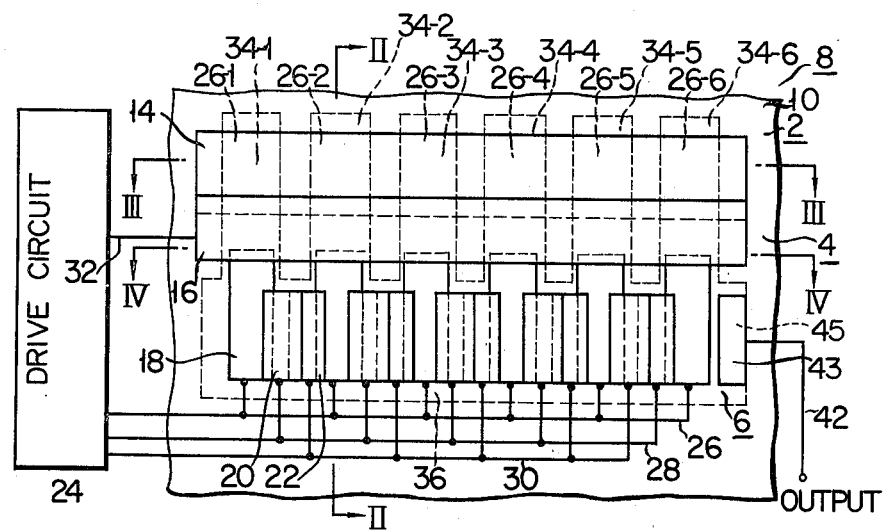
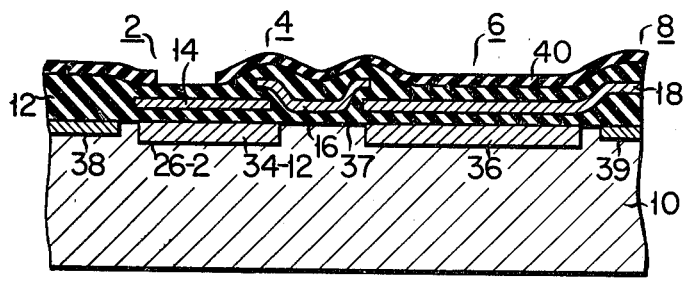
FIG. 2
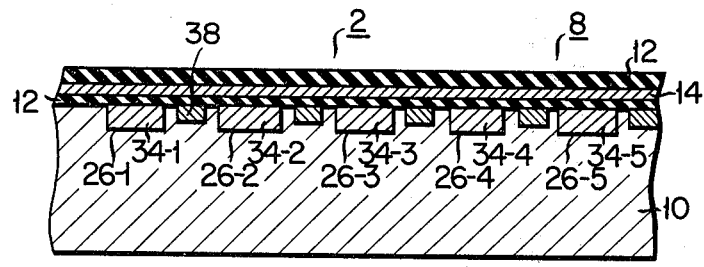
FIG. 3
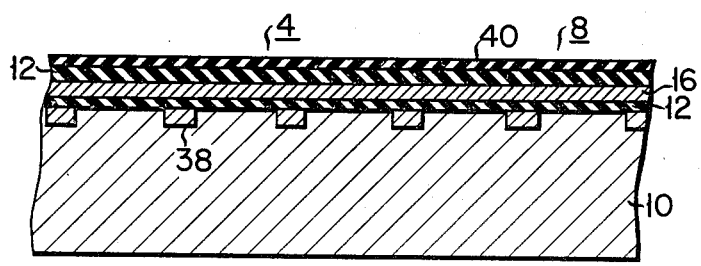
FIG. 4

SOLID STATE IMAGE SENSING DEVICE FOR ENHANCED CHARGE CARRIER ACCUMULATION

This is a continuation of application Ser. No. 893,829, 4-6-78, now abandoned.

BACKGROUND OF THE INVENTION

This invention relates to a solid state image sensing device, and more particularly a charge transfer device type image sensor.

Solid state image sensing device is well known and various improvements have been made. More particularly, so called buried channel type charge transfer device provided with a buried channel formed by diffusing into a semiconductor substrate an impurity having a conductivity type opposite to that of the substrate are disclosed in copending U.S. patent applications Ser. No. 296,507 filed on Oct. 10, 1972 and Ser. No. 403,244 filed on Oct. 3, 1973. While the buried channels can improve the efficiency of drifting electric carriers, there are the following two problems.

The first problem is that the construction of the drive circuit of the charge transfer device type image sensor is complicated. Thus, an image sensor should be provided with means for impressing a pulse to a shift electrode and a charge transfer electrode and means for impressing a pulse to a photoelectrode as indispensable elements. Accordingly, elimination of one of these pulse impressing means simplifies the construction of the drive circuit and decreases the chance of mis-operation.

The second problem is that as the quantity of the electric charge that can be accumulated in a potential well beneath the photoelectrode is relatively small, it is necessary to increase the area of respective picture elements beneath the photoelectrode in order to increase the charge quantity. As is well known in the art, the maximum charge quantity that can be accumulated in the buried channel layers beneath the photoelectrode and corresponding to respective picture elements can be approximately shown by $(C_1+C_2)V_1$, where $C_1$ represents the effective electrostatic capacitance between a buried channel layer and a photoelectrode per one picture element, $C_2$ the effective electrostatic capacitance between a buried channel layer and a semiconductor substrate per one picture element, and $V_1$ the difference between the high and low level potentials impressed upon the photoelectrode or the shift electrode. By experience, it was found that the most suitable conditions of preparing a buried channel charge transfer device are to use a silicon wafer having a resistivity of 5 to 30 ohm-cm as a substrate, a silicon oxide film having a thickness of 0.1 to 0.2 micron as an insulating film, and to use an impurity concentration of the buried channel layer of the order of several to 30 times of that of the semiconductor substrate and a depth of the diffused impurity of about 0.5 to 2 microns. With these optimum conditions the value of $(C_1+C_2)$ becomes from one half to a small fraction of the electrostatic capacitance $C_O$ of the insulating film for each picture element. For this reason, in order to increase the quantity of the saturation light of the image sensor and to relatively increase the dynamic range it is necessary to increase the area of the picture element. As the area of the picture element increases, the area of the active region of the image sensor increases thus increasing the number of defective picture elements and decreasing the yield. Moreover, as the picture element increases, the dark current also increases.

SUMMARY OF THE INVENTION

Accordingly, it is an object of this invention to provide an improved solid state image sensing device capable of increasing the charge quantity that can be accumulated in a potential well beneath an photoelectrode or an accumulation electrode with the result that the area of each picture element can be made relatively small.

Another object of this invention is to provide a novel solid state image sensing device which is not required to use means for impressing a pulse upon the photoelectrode or the accumulation electrode thereby simplifying the construction of the drive circuit.

According to this invention, there is provided a solid state image sensing device comprising a semiconductor substrate of one conductivity type, a photosensitive channel layer formed on one surface of the semiconductor substrate and having an opposite conductivity type for forming charge carriers proportional to the quantity of light incident upon a portion of the first channel layer, a buried channel layer of the opposite conductivity type formed on the surface of the semiconductor substrate at a position spaced from the photosensitive channel layer, an insulating layer formed on the photosensitive and buried channel layers and on a surface of the semiconductor substrate between the photosensitive and buried channel layers, a charge accumulation electrode formed on the insulating layer overlaying the photosensitive channel layers for accumulating the charge carriers in potential wells formed in the photosensitive channel layer, a charge shift electrode formed on the insulating layer overlaying said portion of the semiconductor substrate for shifting the charge packets accumulated in the potential well, and a charge transfer electrode formed on the insulating layer overlaying the buried channel layer for temporarily accumulating the shifted charge packets in potential wells formed in the buried channel layer and then transferring the charge carriers through the buried channel layer to an output line.

BRIEF DESCRIPTION OF THE DRAWING

FIG. 1 is a diagrammatic plan view showing one embodiment of the charge transfer device type image sensor according to this invention, in which an opaque film and an insulating film have been removed for clearly showing the arrangement of the electrodes;

FIGS. 2, 3 and 4 are sectional views taken along lines II—II, III—III and IV—IV respectively in FIG. 1 and showing the opaque film and the insulating film not shown in FIG. 1;

DESCRIPTION OF THE PREFERRED EMBODIMENTS

Figure 5:
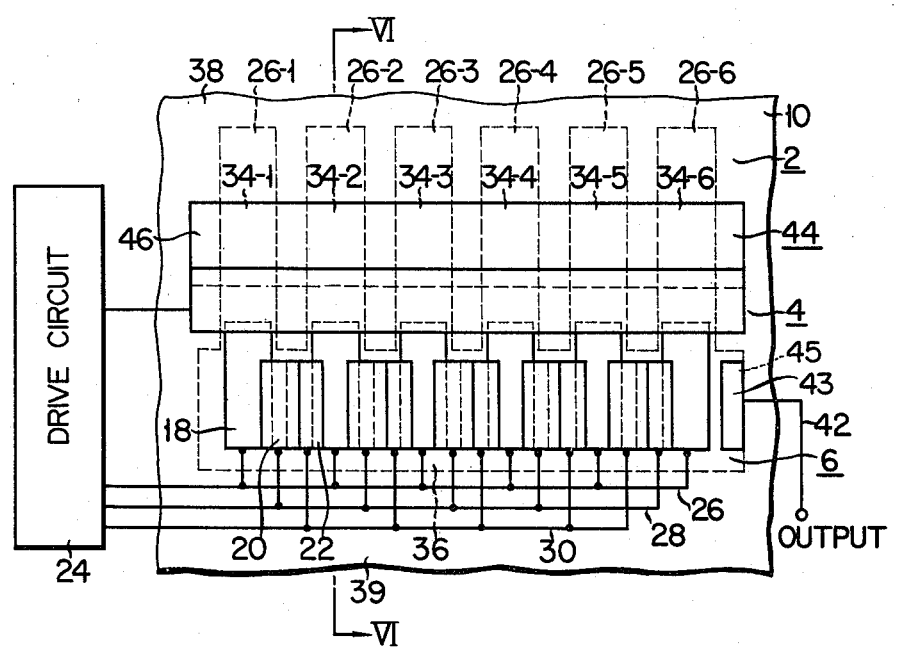
FIG. 5 is a diagrammatic plan view showing a modified charge transfer device type image sensor of this invention in which the opaque film and the insulating film have also been removed for clearly showing the arrangement of the electrodes.

A one dimensional charge transfer device type image sensor 8 of one embodiment of this invention, shown in FIGS. 1 to 4, comprises a photoregion 2, a charge shift region 4 and a CCD (charge coupled device) shift register region or readout shift region 6. These regions 2, 4 and 6 are formed on a semiconductor substrate 10. An elongated photoelectrode 14 of the photoregion 2, an elongated charge shift electrode 16 of the charge shift region 4 and a plurality of charge transfer electrodes 18, 20 and 22 are buried in an insulating film 12 which is overlapped on the substrate 10. The photoelectrode 14 extends in the transverse direction of the substrate, the charge shift electrode 16 extends in parallel with the photoelectrode 14 and the charge transfer electrode 18, 20 and 22 are disposed at right angles with respect to the charge shift electrode 16. As is clearly shown in FIG. 2, the opposite ends of the charge shift electrode 16 are disposed above the ends of the photoelectrode 14 and the charge transfer electrode 18 to overlie these ends. The charge transfer electrodes 18, 20 and 22 are connected to a drive circuit 24 of the image sensor through lines 26, 28 and 30 respectively and the charge shift electrode 16 is connected to the drive circuit 24 through a line 32. Suppose now that the charge carriers accumulated in the CCD shift register region 6 are transferred by three phase clock pulse generated by the drive circuit 24, the image sensor device is provided with a number of sets of the charge transfer electrodes, each set being constituted of the first, second and third electrodes 18, 20 and 22 as shown in FIG. 1, which set corresponding in number to the picture element or the photoelements 26-1 to 26-6. Alternatively the drive circuit 24 may generate single phase, two phase or four phase clock pulse for transferring the charge carriers, in which case the number of the charge transfer electrodes of the shift register region varies depending upon the type of the clock pulse applied thereto. The shift electrode 16 is connected to the drive circuit 24 via line 32 to receive a suitable clock pulse from the drive circuit. Although the photoelectrode 14 is not supplied with the clock pulse, it may be connected to the drive circuit 24 to receive a suitable DC bias voltage, or may be connected to the substrate to receive a zero bias voltage. The photoelectrode comprises an optically transparent electrode and made of a material having a sufficiently small resistance, for example polycrystalline silicon doped with an impurity at a high concentration.

In the surface of the substrate 10 beneath the photoelectrode 14 and the charge transfer electrodes 18, 20 and 22, layers 34-1 through 34-6 and 36 are formed by diffusing an impurity having the opposite conductivity type as the substrate and in which the photosensitive and buried channels are buried. These layers in which photosensitive and buried channels are buried are formed in the area bounded by broken line in FIG. 1. The area outside the broken lines substantially corresponds to the channel stop layers 38, 39 formed in the surface of the substrate 10 and including in high impurity an impurity of the same conductivity type as that of the substrate 10. In that substrate portion 37 corresponding to the charge shift region 4 no channel layer is formed as shown in FIG. 4 and in consequence the substrate surface portion 37 is exposed. In the photoregion 2 and charge shift region 4, the channel stop layer 38 is formed in a digital form as shown in FIGS. 1 and 3 and in consequence the embedded channel layers 34-1 ... 34-6 in the photoregion 2 define mutually isolated, substantially rectangular islands. In the rectangular channel layers 34-1 ... 34-6 are formed photoelements 26-1 ... 26-6, respectively, each of which constitutes one picture element. A light incident on these region is converted to carriers. A substantially whole area of the insulating film except for the photoregion 2 is covered by an optically opaque film 40. As the photoregion 2 is not provided with an opaque film 40 light can reach photosensitive channel layer 34 through the insulating film 12 and the photoelectrode 14.

The output line 42 is connected through the output electrode 43 to the output diode 45. The output diode 45 is provided on the end portion of the buried channel region 36 of the CCD shift register region. The output diode 45 is formed by diffusing an impurity the same as, and higher in concentration than, that of the channel region 36. The output electrode 43 in ohmic contact with that higher concentration portion of the channel region 36.

A well-known floating junction type charge detector may be used in place of the output diode 45 and output electrode.

Conditions desired for the charge transfer device type image sensor 8 to manifest desirable characteristics are as follows. More particularly, it is advantageous that the semiconductor substrate 10 is made of a silicon wafer having a resistivity to higher than several ohm-cms, and that the insulating film comprises a silicon oxide film or a composite construction of a silicon nitride film and a silicon oxide film. It is advantageous to fabricate the photoelectrode 14, the charge shift electrode 16 and the charge transfer electrodes 18, 20 and 22 with polycrystalline silicon containing an impurity at a high concentration for the sake of ready fabrication. It is advantageous that the thickness of the insulating film between the semiconductor substrate 10 and the photoelectrode 14 or the charge shift electrodes 16 or the charge transfer electrodes 18, 20 and 22 is about 0.08 to 0.2 micron, that the impurity concentration of the channel stop layer 12 is higher than $10^{16} cm^{-3}$, that the impurity concentration of the channel layers 34-1 through 34-6 and 36 is about $5 \times 10^{15}$ to $5 \times 10^{16} cm^{-3}$ (determined by experiments) and that the thickness of these channel layers is about 0.2 to 5 microns.

The charge transfer device type image sensor 8 described above operates as follows.

At an initial stage of charge accumulation, rectangular photosensitive channel layer 34-2 is deficient of the charge carriers so that a potential well corresponding to the picture element 26-2 is formed beneath the photoelectrode 14 which is maintained at zero bias or a constant DC bias potential. Charge carriers are created by the light energy incident upon the photoelement 26-2 formed by the junction between the first buried channel layer 34-2 and the substrate 10 and accumulated in the potential well corresponding to the picture element 26-2. When a definite time elapses sufficient to accumulate a sufficient quantity of the charge carriers or a signal charge in the potential well, the shift electrode 16 is energized by a clock pulse applied from the drive circuit 24. Then the accumulated charge carriers are transferred to the potential well of the buried channel region 36 beneath the CCD shift register region 6 through the surface portion 37 of the substrate beneath the charge shift electrode 16. The first to third electrodes 18, 20 and 22 of the CCD shift register region 6 are supplied with a clock pulse having a larger voltage than the clock pulse applied to the charge shift electrode 16 from the drive circuit 24. Accordingly, the potential well formed below the photoelectrode 14 is shallower than that formed beneath the charge transfer electrodes 18, 20 and 22. As a consequence, all charge carriers will be transferred to the potential well beneath the first charge transfer electrode 18. The signal charges temporarily accumulated in this potential well are transferred to the CCD shift register region 6 by clock pulses applied to the first to third charge transfer electrodes 18, 20 and 22 corresponding to respective picture elements and then sequentially read out through output line 42.

When the clock pulse applied to the charge shift electrode 16 ceases, the operation described above commences again.

As can be noted from the foregoing description according to this invention, it is possible to operate the photoelectrode 14 at the same zero potential as the semiconductor substrate 10 without applying thereto a clock pulse thus greatly simplifying the drive circuit than the prior art device. Further, there is an advantage that the maximum quantity of the accumulated charge is larger than the prior art device.

More particularly, in the embodiment shown in FIG. 1, the maximum quantity of the charge accumulated in the potential well formed beneath the island shaped photosensitive channel layers 34-1 through 34-6 is determined by the height of the potential barrier controlled by the shift electrode 16. When manufactured by an ordinary method, the interface potential beneath the shift electrode 16 under no voltage applying condition is near zero volt. Consequently, the maximum quantity of the charge $Qm_2$ accumulated on one picture element is approximately equal to $eNd_2S$, where e represents the charge of an electron, N the carrier concentration of the photosensitive channel layers 34-1 through 34-6, $d_2$ the thickness of these photosensitive channel layers, and S the area of the photosensitive channel layers of one of the picture elements 26-1 through 26-6. On the other hand, the maximum quantity of the charge $Qm_1$ of the prior art device is approximately equal to $m\epsilon_1 S V_1/d_1$ where $d_1$ represents the thickness of the insulating film 12 beneath the photoelectrode 14, $\epsilon_1$ the dielectric constant of the insulating film 12, and m a coefficient determined by the device parameters and having a value of about 0.5 to 0.2. Accordingly, with the same area of the picture elements, $Qn_2/Qn_1 = eNd_2d_1/(m\epsilon_1V_1)$. Typical values that give excellent characteristics are $Nd_2 = 10^{12} cm^{-2}$, $d_1 = 0.15$ micron, $m = 0.4$, $V_1 = 6V$. Where a silicon oxide film is used as the insulating film 12, and a silicon wafer is used as the semiconductor substrate 10, the value of $Qm_2/Qm_1$ is about 3. Thus, with the same area of the picture elements, the device of this invention can accumulate charge of about three times that of the prior art device. In other words, according to the image sensor of this invention it is possible to decrease the area of the photoelectrode 14 corresponding to the photoelement necessary to obtain sufficient quantity of charge carriers, that is, the area of the photosensitive channel corresponding to the area of one of the picture elements 26-1 through 26-6. Moreover as the area of the photoelement is decreased the number of defects of the image picture element can be decreased, thus improving the yield. As the area of the photoelement decreases, the dark current formed therein decreases also thus improving the S/N ratio of the device.

A modified embodiment of the charge transfer device type image sensor 8 of this invention will be described with reference to FIGS. 5 and 6 in which elements corresponding to those shown in FIGS. 1 through 4 are designated by the same reference characters. In this modification, photoelectrode 14 to be provided for the photoregion 2 is eliminated and only the insulating film 12 is formed on the photosensitive buried channel layer 34 because the photoelectrode 14 is made of polycrystalline silicon having a characteristics capable of absorbing light having wavelength in the region of blue color range. As above described, the insulating film 12 is made of a silicon oxide film or a composite film of silicon nitride and silicon oxide which does not absorb light in the visible range. As shown, a charge accumulation region 44 is interposed between the photoregion 2 and the shift region 4, and a charge accumulation electrode 46 is buried in the insulating film 12 in the charge accumulation region. Photosensitive buried channel layers 34-1 through 34-6 are formed on the surface of the substrate 10 beneath the charge accumulation electrode 46. As can be noted from FIG. 6, in this embodiment there is no buried channel layer on the surface of the substrate 10 beneath the charge shift electrode 16. Similar to the photoelectrode 14 of the embodiment shown in FIGS. 1 through 4, the charge accumulation electrode 46 is maintained at zero potential or at a definite potential thus forming a potential well in the channel region thereunder. However, the insulating film 12 on the charge accumulation electrode 46 is covered by an opaque film 40 so as to not transmit light through the charge accumulation well. Accordingly, it is not necessary to fabricate the charge accumulation electrode with transparent material.

In this modification, the charge carriers generated by the photoelements 26-1 through 26-6 in the photoregion corresponding to the quantity of the incident light are temporarily accumulated in the potential well formed in the photosensitive channel regions 34-1 through 34-6 formed beneath the charge accumulation electrode 46. These accumulated charge carriers are transferred into the potential well formed in the channel region 36 below the charge transfer region 6 when the shift electrode is energized as above described, and then read out.

Figure 6:
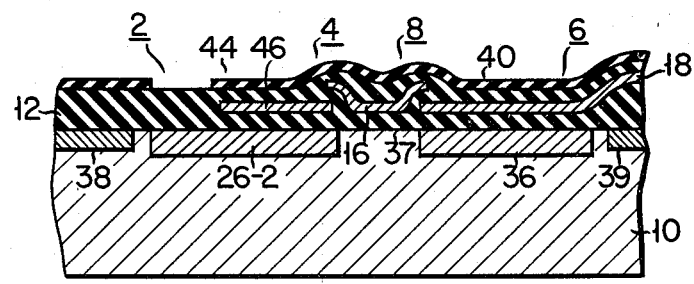
FIG. 6 is a sectional view taken along a line VI—VI shown in FIG. 5 and shows the opaque film and the insulating film not shown in FIG. 5.

The modified image sensor 8 shown in FIGS. 5 and 6 is more advantageous than the image sensor shown in FIG. 1 through 4 in that it has larger photosensitivity to the light in the visible range. This advantage is caused by the fact that the photoelectrode 14 having a tendency of absorbing light in the blue colour range is not formed in the photoregion 2.

Figure 7:
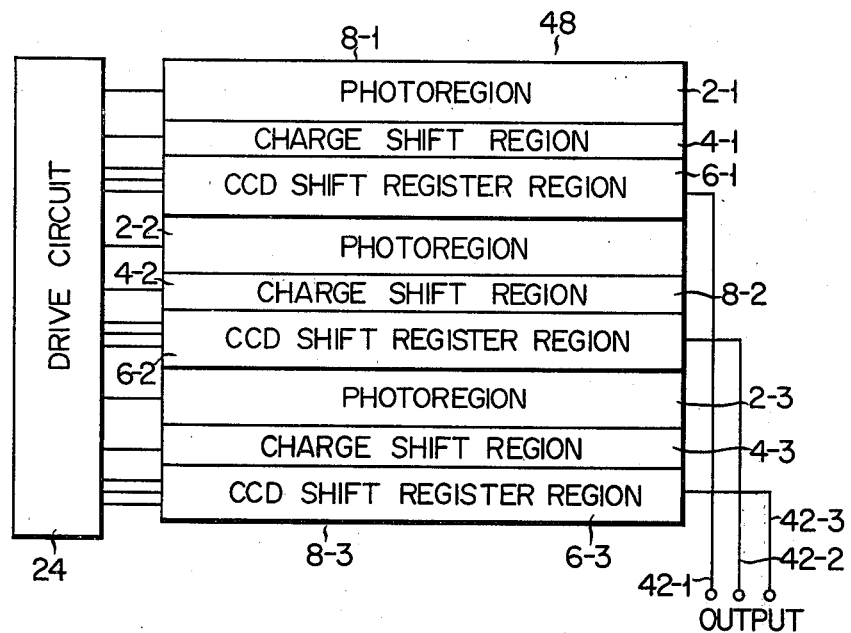
FIG. 7 is a block diagram showing a two dimensional image sensor embodying the invention.
Figure 8:
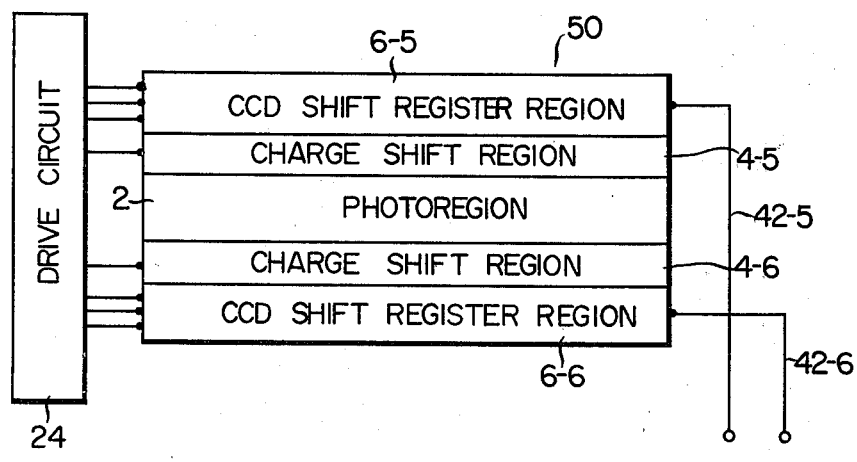
FIG. 8 is a block diagram showing another modification of the image sensor of this invention.

A modified image sensor 48 shown in FIG. 7 is a two dimensional image sensor comprising a combination of a plurality of (in this example 3) one dimensional image sensors 8-1, 8-2 and 8-3, shown in FIG. 1. Thus, it should be understood that the image sensor of this invention is applicable not only to the one dimensional sensor but also to the two dimensional sensor. While the image sensor 50 shown in FIG. 8 is a one dimensional sensor, it comprises two charge shift regions 4-5 and 4-6 and two CCD shift register regions 6-5 and 6-6. These two charge shift regions and two CCD shift register regions are positioned on the opposite sides of the photoregion 2 so as to transfer the charge carriers of a specific picture element to the other CCD shift register region while the charge carriers of the other picture element are transferred to the other CCD shift register regions so that the information regarding the specific picture element and the other picture element are read out from the two CCD shift register regions. Although the image sensor 50 of the type shown in FIG. 8 is well known in the art, the invention is also applicable to the image sensor of this type. Although the image sensor 8 described above comprises a composite electrode construction having two superposed layers of polycrystalline silicon, the image sensor may have other well known constructions. If complication of the drive circuit 24 is permitted, a clock pulse may be applied to the charge accumulation electrode 46 or to the photoelectrode 14, in which case the quantity of the charges that can be accumulated in the potential well beneath the charge accumulation electrode 46 or the photoelectrode 14 can be increased sufficiently. Furthermore, the concentration and the thickness of the charge carriers in the photosensitive buried channel layers 34-1 through 34-6 beneath the photoregion 2 or the charge accumulation region 44 are not necessarily equal to those of the buried channel layers 36 of the charge shift register region 6.

What is claimed is:

1. A charge coupled image sensing device comprising:

a semiconductor substrate of one conductivity type;

an insulating layer formed on a surface of said semiconductor substrate;

a photosensitive section including a first portion of said substrate, a plurality of photosensitive channel layers of the opposite conductivity type formed in the first portion adjacent to said surface and mutually isolated and arranged in a row, and a single charge accumulating electrode formed on said insulating layer, overlaid on the row of photosensitive channel layers and maintained at a constant potential, said photosensitive section producing charge carriers and accumulating the charge carriers in photosensitive potential wells formed in the first portion of said substrate;

a CCD charge transfer readout section including a second portion of said substrate, a buried channel layer of the opposite conductivity type formed in a second portion of said substrate adjacent to said surface and spaced apart from said row of photosensitive channel layers and a plurality of charge transfer electrodes formed on said insulating layer, overlaid on the buried channel layer and supplied with clock pulses, said CCD charge transfer readout section temporarily accumulating shifted charge carriers in transfer potential wells for subsequent transference which are deeper than the photosensitive potential wells and are formed in the second portion of said substrate;

a charge shift section including a third portion of said substrate between the first and second portions and a single charge shift electrode formed on said insulating layer, overlaid on the surface of the third portion of said substrate and overlaying a portion of the adjacent side edges of the charge transfer electrodes and the charge accumulating electrode and supplied with a clock pulse, said charge shift section lacking a channel layer between said photosensitive channel layers and said barrier channel layer of said CCD charge transfer section, in said charge shift section when the charge shift electrode is maintained at a predetermined potential, a barrier being provided in the third portion between the photosensitive potential wells and the transfer potential wells and when the charge shift electrode is maintained at another potential, a shift potential well which is deeper than the photosensitive potential wells and shallower than the transfer potential wells being formed in the third portion so that the produced change carriers are shifted from the photosensitive potential wells to the transfer potential wells through the shift potential wells; and an output section formed in the second portion of said substrate and electrically connected to said CCD charge transfer section to receive the charge carriers from said CCD charge transfer section.

2. The charge coupled image sensing device according to claim 1 wherein said charge accumulation electrode comprises a transparent photoelectrode that transmits incident light to said photosensitive channel layers.

3. The coupled image sensing device according to claim 1 wherein said semiconductor substrate in which said photosensitive and buried channel layers are formed is made of a silicon wafer having a resistivity of higher than several ohm-centimeters, said insulating layer is made of silicon oxide, said charge accumulation electrode, said charge transfer electrodes and said charge shift electrode are made of polycrystalline silicon having a high impurity concentration.

4. The charge coupled image sensing device according to claim 3 wherein said insulating layer comprises a composite construction including a silicon nitride film and a silicon oxide film.

5. The charge coupled image sensing device according to claim 1 wherein said insulating layer has a thickness of about 0.08 to 0.2 micron, said photosensitive and buried channel layers have an impurity concentration of from about $5 \times 10^{15}$ to $5 \times 10^{16} cm^{-3}$ and a thickness of about 0.5 to 2 microns.

6. The charge coupled image sensing device according to claim 1 wherein said photosensitive and buried channel layers and said surface portion of said semiconductor substrate are bounded by channel stops formed in said semiconductor substrate adjacent to the surface and containing a high concentration impurity of the same conductivity type as said semiconductor substrate.

7. The charge coupled image sensing device according to claim 6 wherein said channel stops have an impurity concentration of higher than $10^{16} cm^{-3}$.

* * * * *